United States Patent
Poulsen

(10) Patent No.: US 11,637,546 B2
(45) Date of Patent: Apr. 25, 2023

(54) PULSE DENSITY MODULATION SYSTEMS AND METHODS

(71) Applicant: SYNAPTICS INCORPORATED, San Jose, CA (US)

(72) Inventor: Jens Kristian Poulsen, Kitchener (CA)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/716,413

(22) Filed: Dec. 16, 2019

(65) Prior Publication Data

US 2020/0195235 A1 Jun. 18, 2020

Related U.S. Application Data

(60) Provisional application No. 62/795,501, filed on Jan. 22, 2019, provisional application No. 62/780,144, filed on Dec. 14, 2018.

(51) Int. Cl.
*G06F 1/04* (2006.01)
*H03K 3/017* (2006.01)
(Continued)

(52) U.S. Cl.
CPC .......... *H03K 3/017* (2013.01); *G05B 19/045* (2013.01); *H04L 12/40019* (2013.01);
(Continued)

(58) Field of Classification Search
CPC .......... G06F 3/16; G06F 3/162; G06F 3/165; G06F 3/167; G10L 15/08; G10L 15/22; G10L 15/222; G10L 15/28; G10L 2015/088; H03K 2217/94005; H03K 3/017; H03K 4/026; H03K 7/08; H03K 8/08; H04L 12/40013; H04L 12/10019;
(Continued)

(56) References Cited

U.S. PATENT DOCUMENTS 6,301,366 B1 * 10/2001 Malcolm, Jr. .......... H04H 60/04
381/119
8,036,401 B2  10/2011 Poulsen et al.
(Continued)

OTHER PUBLICATIONS

U.S. Appl. No. 16/125,617, filed Sep. 7, 2018.

*Primary Examiner* — Thomas H Maung
(74) *Attorney, Agent, or Firm* — Paradice & Li LLP

(57) ABSTRACT

Systems and methods for programmable pulse density modulation (PDM) components enable backwards compatibility while maintaining reasonable tolerances. A system includes a programmable PDM device, a PDM master device and a bus communicably coupling the programmable PDM device to the PDM receiver. The PDM device may include an audio sensor, audio input circuitry, a delta-sigma converter and a PDM transmitter and receiver. The PDM transmitter and receiver may send out PDM data from the PDM device and receive programming data from the PDM Master device. The PDM device may further include register space controlled by the PDM master device, a buffer storing audio data for wakeup word systems that store audio data when the PDM receiver is powered down, a bus holder to hold the previous value on the bus if no device is driving it, and/or a clock multiplier to multiply the incoming clock by a factor.

20 Claims, 14 Drawing Sheets

(51) Int. Cl.
*H04L 12/40* (2006.01)
*G05B 19/045* (2006.01)
*G10L 15/08* (2006.01)

(52) U.S. Cl.
CPC ............ *H04L 12/40039* (2013.01); *G05B 2219/2615* (2013.01); *G10L 15/08* (2013.01); *G10L 2015/088* (2013.01)

(58) Field of Classification Search
CPC ......... H04L 12/40026; H04L 12/40039; H04L 12/40117; H04L 12/4013; H04L 25/4902; H04L 27/122; H04L 27/156; H04N 5/928; H04R 1/00; H04R 2205/021; H04R 2420/00; H04R 2420/01; H04R 2420/03; H04R 2420/05; H04R 2420/07; H04R 2420/09; H04R 25/55; H04R 25/556; H04R 29/004; H04R 29/005; H04R 29/006; H04R 3/00; H04R 5/04
See application file for complete search history.

(56) References Cited

U.S. PATENT DOCUMENTS

| | | | | |
|---|---|---|---|---|
| 9,076,447 | B2 * | 7/2015 | Nandy | G10L 15/20 |
| 9,147,397 | B2 * | 9/2015 | Thomsen | G10L 19/0204 |
| 2004/0019725 | A1 | 1/2004 | Ellerbrock et al. | |
| 2007/0127761 | A1 | 6/2007 | Poulsen | |
| 2009/0003629 | A1 * | 1/2009 | Shajaan | H04R 3/00 381/113 |
| 2010/0158037 | A1 | 6/2010 | Heinke et al. | |
| 2011/0255709 | A1 * | 10/2011 | Nishimura | H04S 1/007 381/92 |
| 2012/0120082 | A1 | 5/2012 | Ku et al. | |
| 2012/0300960 | A1 * | 11/2012 | Mackay | H04R 3/005 381/119 |
| 2013/0058495 | A1 * | 3/2013 | Furst | H03K 19/017509 381/80 |
| 2013/0197920 | A1 * | 8/2013 | Lesso | H04L 25/4902 704/500 |
| 2013/0322461 | A1 | 12/2013 | Poulsen | |
| 2013/0322462 | A1 * | 12/2013 | Poulsen | H04J 3/06 370/458 |
| 2014/0112501 | A1 * | 4/2014 | Yeh | H04R 3/00 381/122 |
| 2014/0244269 | A1 * | 8/2014 | Tokutake | G10L 15/00 704/275 |
| 2014/0281079 | A1 | 9/2014 | Biskup | |
| 2014/0343949 | A1 * | 11/2014 | Huang | H04R 3/00 704/275 |
| 2015/0058001 | A1 * | 2/2015 | Dai | H04R 3/00 704/231 |
| 2015/0073795 | A1 * | 3/2015 | Tan | G10L 15/063 704/243 |
| 2015/0125004 | A1 * | 5/2015 | Cagdaser | H04R 1/08 381/111 |
| 2015/0245154 | A1 * | 8/2015 | Dadu | G10L 15/22 381/56 |
| 2016/0034416 | A1 * | 2/2016 | Chavez | G06F 13/4282 381/59 |
| 2016/0066113 | A1 * | 3/2016 | Elkhatib | G06F 1/3287 381/56 |
| 2017/0153684 | A1 | 6/2017 | Balasubramanian | |
| 2017/0230750 | A1 * | 8/2017 | Pawlowski | H04R 1/08 |
| 2018/0005636 | A1 * | 1/2018 | Lesso | H04R 3/00 |
| 2018/0060269 | A1 * | 3/2018 | Kessler | G06F 13/4022 |
| 2018/0173490 | A1 * | 6/2018 | Amarilio | G06F 3/165 |
| 2019/0147884 | A1 * | 5/2019 | Hirani | G06F 3/162 704/231 |
| 2019/0279641 | A1 * | 9/2019 | Simileysky | G06F 3/167 |
| 2019/0287549 | A1 * | 9/2019 | Poulsen | G06F 3/162 |
| 2020/0097245 | A1 * | 3/2020 | Gonzalez | H04L 12/40019 |

* cited by examiner

| Timeslot | 0 | 1  | 2 | 3 | 4 | 5  | 6 | 7 | 8 | 9  | 10 | 11 | 12 | 13 | 14 | 15 |
|----------|---|----|---|---|---|----|---|---|---|----|----|----|----|----|----|----|
| Value    | H | K0 | H | H | H | L0 | H | H | H | K1 | H  | H  | H  | L1 | H  | H  |
| Driver   | B | S0 | B | B | B | S1 | B | B | B | S0 | B  | B  | B  | S1 | B  | B  |

FIG. 10

PDM data from microphone 0

1 = START 0 1 1 1  OPCODE = READ16

| Timeslot | 0  | 1  | 2  | 3  | 4  | 5  | 6  | 7  | 8  | 9  | 10 | 11 | 12 | 13 | 14 | 15 |
|----------|----|----|----|----|----|----|----|----|----|----|----|----|----|----|----|----|
| Value    | H  | K0 | H  | /K0 | H  | L0 | H  | H  | H  | K1 | H  | 0  | H  | L1 | H  | H  |
| Driver   | B  | S0 | B  | M  | B  | S1 | B  | B  | B  | S0 | B  | M  | B  | S1 | B  | B  |
| Timeslot | 16 | 17 | 18 | 19 | 20 | 21 | 22 | 23 | 24 | 25 | 26 | 27 | 28 | 29 | 30 | 31 |
| Value    | H  | K2 | H  | 1  | H  | L0 | H  | H  | H  | K3 | H  | 1  | H  | L1 | H  | H  |
| Driver   | B  | S0 | B  | M  | B  | S1 | B  | B  | B  | S0 | B  | M  | B  | S1 | B  | B  |
| Timeslot | 32 | 33 | 34 | 35 | 36 | 37 | 38 | 39 | 40 | 41 | 42 | 43 | 44 | 45 | 46 | 47 |
| Value    | H  | K4 | H  | 1  | H  | L0 | H  | H  | H  | K5 | H  | 1  | H  | L1 | H  | H  |
| Driver   | B  | S0 | B  | M  | B  | S1 | B  | B  | B  | S0 | B  | M  | B  | S1 | B  | B  |
| Timeslot | 48 | 49 | 50 | 51 | 52 | 53 | 54 | 55 | 56 | 57 | 58 | 59 | 60 | 61 | 62 | 63 |
| Value    | H  | K6 | H  | 1  | H  | L0 | H  | H  | H  | K7 | H  | 1  | H  | L1 | H  | H  |
| Driver   | B  | S0 | B  | M  | B  | S1 | B  | B  | B  | S0 | B  | M  | B  | S1 | B  | B  |

1 1 1  ADDRESS: 0xF...

FIG. 11

| | START | READ16 | | | | F | | | | 9 | | | | 0 | | |
|---|---|---|---|---|---|---|---|---|---|---|---|---|---|---|---|---|
| Timeslot | 3 | 11 | 19 | 27 | 35 | 43 | 51 | 59 | 67 | 75 | 83 | 91 | 99 | 107 | 115 | 123 |
| Value | /K0 | 0 | 1 | 1 | 1 | 1 | 1 | 1 | 1 | 1 | 0 | 0 | 1 | 0 | 0 | 0 |
| Driver | M | M | M | M | M | M | M | M | M | M | M | M | M | M | M | M |

| | | | 1 | | | | | 8 | | | | | 1 | | | C | |
|---|---|---|---|---|---|---|---|---|---|---|---|---|---|---|---|---|---|
| Timeslot | 131 | 139 | 147 | 155 | 163 | 171 | 179 | 187 | 195 | 203 | 211 | 219 | 227 | 235 | 243 | 251 |
| Value | 0 | 0 | 0 | 0 | 1 | 1 | 0 | 0 | 0 | 0 | 0 | 0 | 1 | 1 | 1 | 0 |
| Driver | M | M | M | M | M | S0 | S0 | S0 | S0 | S0 | S0 | S0 | S0 | S0 | S0 | S0 |

| | | | 7 | | | PAR | ACK |
|---|---|---|---|---|---|---|---|
| Timeslot | 259 | 267 | 275 | 283 | 291 | 299 | 307 |
| Value | 0 | 0 | 1 | 1 | 1 | PAR | /K38 |
| Driver | S0 | S0 | S0 | S0 | S0 | M | S0 |

FIG. 12

| | START | WRITE16 | | | | 7 | | | | 6 | | | | 5 | |
|---|---|---|---|---|---|---|---|---|---|---|---|---|---|---|---|
| Timeslot | 3 | 11 | 19 | 27 | 35 | 43 | 51 | 59 | 67 | 75 | 83 | 91 | 99 | 107 | 115 | 123 |
| Value | /L0 | 1 | 0 | 1 | 1 | 0 | 1 | 1 | 1 | 0 | 1 | 1 | 0 | 0 | 1 | 0 |
| Driver | M | M | M | M | M | M | M | M | M | M | M | M | M | M | M | M |

| | | | 4 | | | 1 | | | 2 | | | 3 | | |
|---|---|---|---|---|---|---|---|---|---|---|---|---|---|---|
| Timeslot | 131 | 139 | 147 | 155 | 163 | 171 | 179 | 187 | 195 | 203 | 211 | 219 | 227 | 235 | 243 | 251 |
| Value | 1 | 0 | 1 | 0 | 0 | 0 | 0 | 0 | 1 | 0 | 0 | 1 | 0 | 0 | 0 | 1 |
| Driver | M | M | M | M | M | M | M | M | M | M | M | M | M | M | M | M |

| | | | 4 | | PAR | ACK |
|---|---|---|---|---|---|---|
| Timeslot | 259 | 267 | 275 | 283 | 291 | 299 | 307 |
| Value | 1 | 0 | 1 | 0 | 0 | PAR | /L38 |
| Driver | M | M | M | M | M | M | S0 |

FIG. 13

PULSE DENSITY MODULATION SYSTEMS AND METHODS

CROSS-REFERENCE TO RELATED APPLICATIONS

The present application claims priority to and the benefit of U.S. Provisional Application No. 62/780,144, titled "Pulse Density Modulation Systems and Methods," filed Dec. 14, 2018, and U.S. Provisional Application No. 62/795,501, titled "Pulse Density Modulation Systems and Methods," filed Jan. 22, 2019, each of which is hereby incorporated by reference in its entirety.

TECHNICAL FIELD

The present application relates generally to systems and methods for audio processing, and more particularly for example, to programmable pulse density components, such as pulse density microphones, pulse density sensors, pulse density amplifiers, and associated programming protocols.

BACKGROUND

There has long been a desire to add programmability to pulse density modulation (PDM) microphones, PDM sensors and PDM amplifiers to decrease pin-count, size and cost. Although some minor progress has been made with respect to PDM amplifiers by using special long sequences, these sequences have been limited to idle mode or very limited configurability. For PDM microphones, the options include using other interfaces (e.g., I²S, I²C, SoundWire), using PDM microphones having limited programmability by changing the clock frequency (e.g., selecting between high performance mode, standard performance mode and low power mode), or utilizing a full clock stop for disabling the PDM device. In view of the foregoing, there is a continued need for PDM microphones, PDM amplifiers and other PDM components that both enable full programmability and support conventional PDM formats over two PDM wires.

SUMMARY

Systems and methods disclosed herein include the addition of programmability to pulse density modulation (PDM) components, including PDM microphones, PDM sensors and PDM amplifiers, while enabling backwards compatibility with existing systems and circuits, and maintaining reasonable tolerances in a real design. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, wherein showings therein are for purposes of illustrating embodiments of the present disclosure and not for purposes of limiting the same. The components in the drawings are not necessarily to scale, emphasis instead being placed upon clearly illustrating the principles of the present disclosure.

FIG. 10 illustrates an example sequence for audio data for a PDM device without programming data, in accordance with one or more embodiments.

FIG. 11 illustrates an example sequence for a programmable PDM device, in accordance with one more embodiments.

FIG. 12 illustrates a programming sequence comprising time slots that include programming data for a programmable PDM device, in accordance with one or more embodiments.

FIG. 13 illustrates programming bits for an output sequence for a programmable PDM device, in accordance with one more embodiments.

DETAILED DESCRIPTION

In various embodiments of the present disclosure, a programmable digital interface suited for pulse density modulation (PDM) components, such as PDM microphones, PDM sensors and PDM amplifiers, is designed to enable backwards compatibility with conventional devices, while enabling programmability with a low gate count overhead.

PDM microphones and amplifiers (and other PDM components) in accordance with the present disclosure can be developed for use in existing and future products thereby simplifying the development and production of advanced PDM microphones and amplifiers. The systems and methods disclosed herein are compatible with existing solutions while at the same time offering programmability. Thus, a single PDM product developed in accordance with the present disclosure may be offered to multiple markets without adding extra costs.

The improvements disclosed herein include backwards compatible enhancements of conventional PDM that do not require extra wires. The improvements include adding register programming to PDM devices, support of enhanced dynamic range, reduced power consumption compared to traditional PDM systems, low gate count overhead and support for longer links (support for larger tolerances are better). Operation of the PDM systems disclosed herein may include special modes that allow multiple bits to be transferred during a half-clock cycle, which enables low power consumption or support of multi-value symbols (e.g., encompassing multiple bits to be transferred over a digital link) to increase the dynamic range without increasing the latency. The PDM systems disclosed herein also support audio buffer download to wakeup word scenarios with zero gaps in the output and no transient distortion.

In some embodiments, when driving a PDM bus a PDM transmitter will keep the output driver active and fixed at one logic level during the half a clock cycle, after which it will disable its output driver. The half-clock cycle over which the PDM transmitter drives the data line is determined by the level of a left/right input pin and the level on the data line is based on the output from a delta-sigma converter located next to this transmitter. This technique is used both for PDM microphones and for PDM amplifiers.

Figure 1:
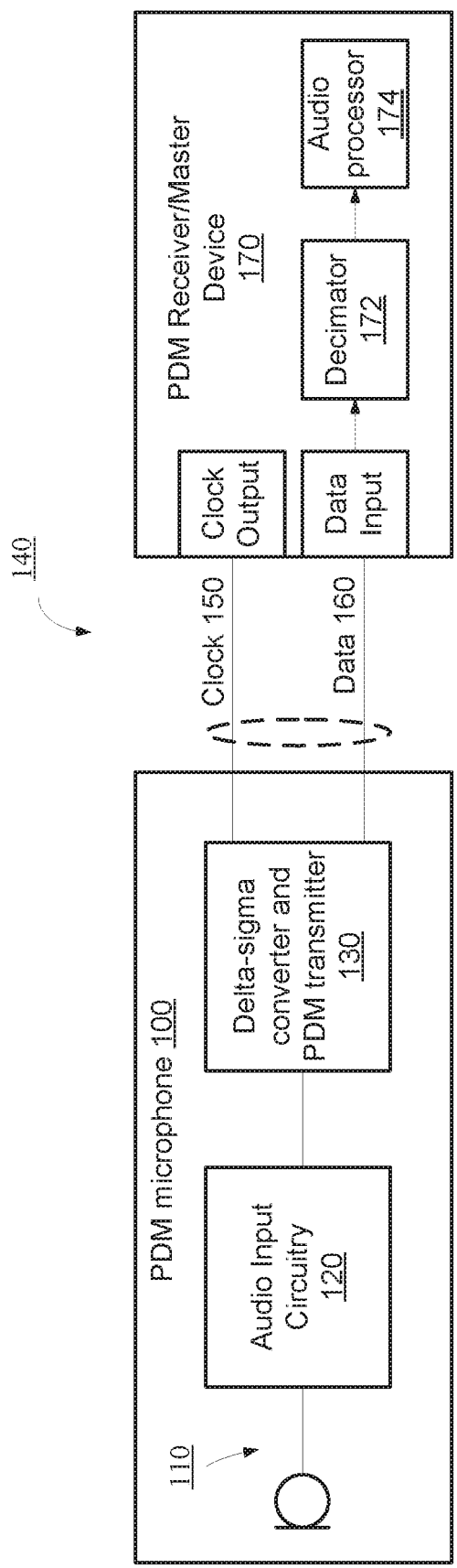
FIG. 1 is an example pulse density modulation (PDM) microphone, in accordance with one or more embodiments.

FIG. 1 illustrates an example implementation of a PDM microphone 100. The PDM microphone 100 shows an example digital PDM microphone using a two-phase approach for data transfers, in order to be able to support two audio channels. The PDM microphone 100 includes an input sensor 110, audio input circuitry 120, and a delta sigma converter and PDM transmitter 130. The PDM transmitter 130 is operable to set an output level during a half-cycle. After setting the output level, the PDM transmitter 130 is operable to maintain the output level using a bus keeper (e.g., a bus holder circuit) or it may simply just disable the output when not active. The PDM microphone 100 is connected to a master device 170 (e.g., a PDM receiver) via a bus 140 that includes a clock signal 150 and a data line 160. The PDM receiver 170 reads the output level at the end of the half-cycle for non-programmable devices (e.g., native PDM devices). The master device 170 includes a clock output, data input, a decimator 172, and an audio processor 174. In order to be able to support programming of PDM devices, the clock cycle may be split into more phases to enable bandwidth for the control signals or the clock signal itself may be modulated to facilitate this extra information. In various embodiments, this approach changes the output driver from an active to tri-state at an earlier point and more times than in conventional PDM systems. Furthermore, a bus holder is used to maintain the correct level for the rest of the half-cycle for backwards compatibility with conventional PDM systems. By flipping this value, programming of PDM microphones (and similarly PDM amplifiers and other PDM components) is enabled, without requiring an increase in the clock frequency and thereby increasing power consumption. In some embodiments, both directions may be able to provide control information. The extra channel allocated at the end of the half-cycle may be used for double-speed transfers, e.g., for lowering the clock frequency and thereby lowering the power consumption or for off-loading an internal buffer after specific power-up events happen such as the detection of a wakeup word. Thus, this approach may enable support of wakeup trigger words without losing desired voice content due to the extra available bandwidth.

It will be appreciated that although the disclosed use case relates to PDM microphones, other PDM components may be used such as amplifiers and sensors. For example, PDM amplifiers have the potential to provide IV sense information back to the controlling processor for inclusion of advanced motional feedback without adding additional pins by utilizing the same technique as described herein.

Figure 2:
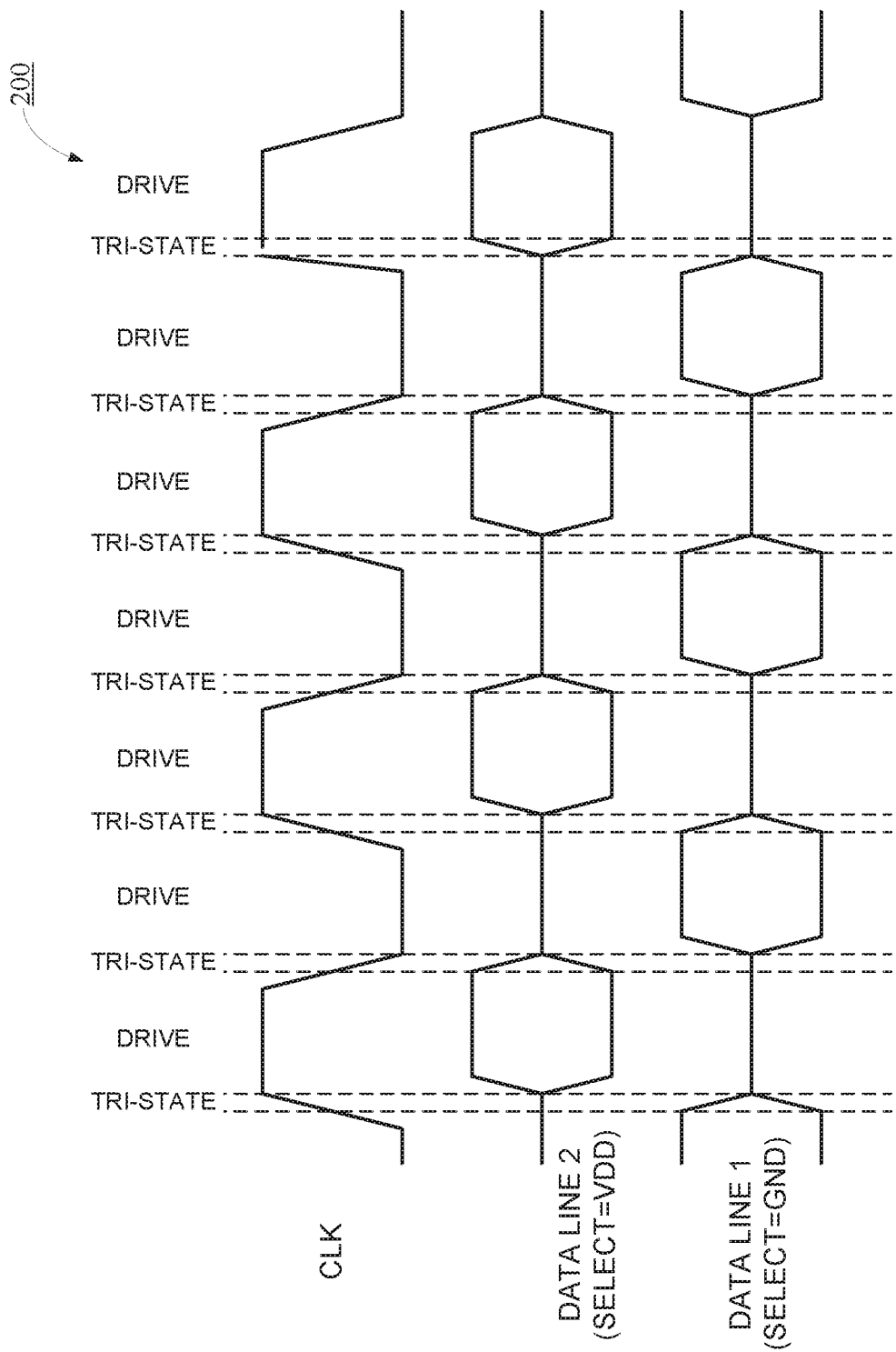
FIG. 2 illustrates an example driving pattern for the PDM microphone of FIG. 1, in accordance with one or more embodiments.

FIG. 2 illustrates a PDM driving pattern 200 of a traditional PDM microphone, including timing of data transfers divided into four phases per clock cycle: (i) tri-state, (ii) drive microphone 1, (iii) tri-state, and (iv) drive microphone 2. The tri-state period is typically handled by ensuring the output driver is disabled faster than it is enabled, e.g., it may be disabled within 16 ns and enabled after at least 18 ns. This type of timing control is performed within the traditional digital microphone. The microphone data are sampled at the clock edges by the PDM receiver (Master device) that normally will include an audio processor.

Figure 3:
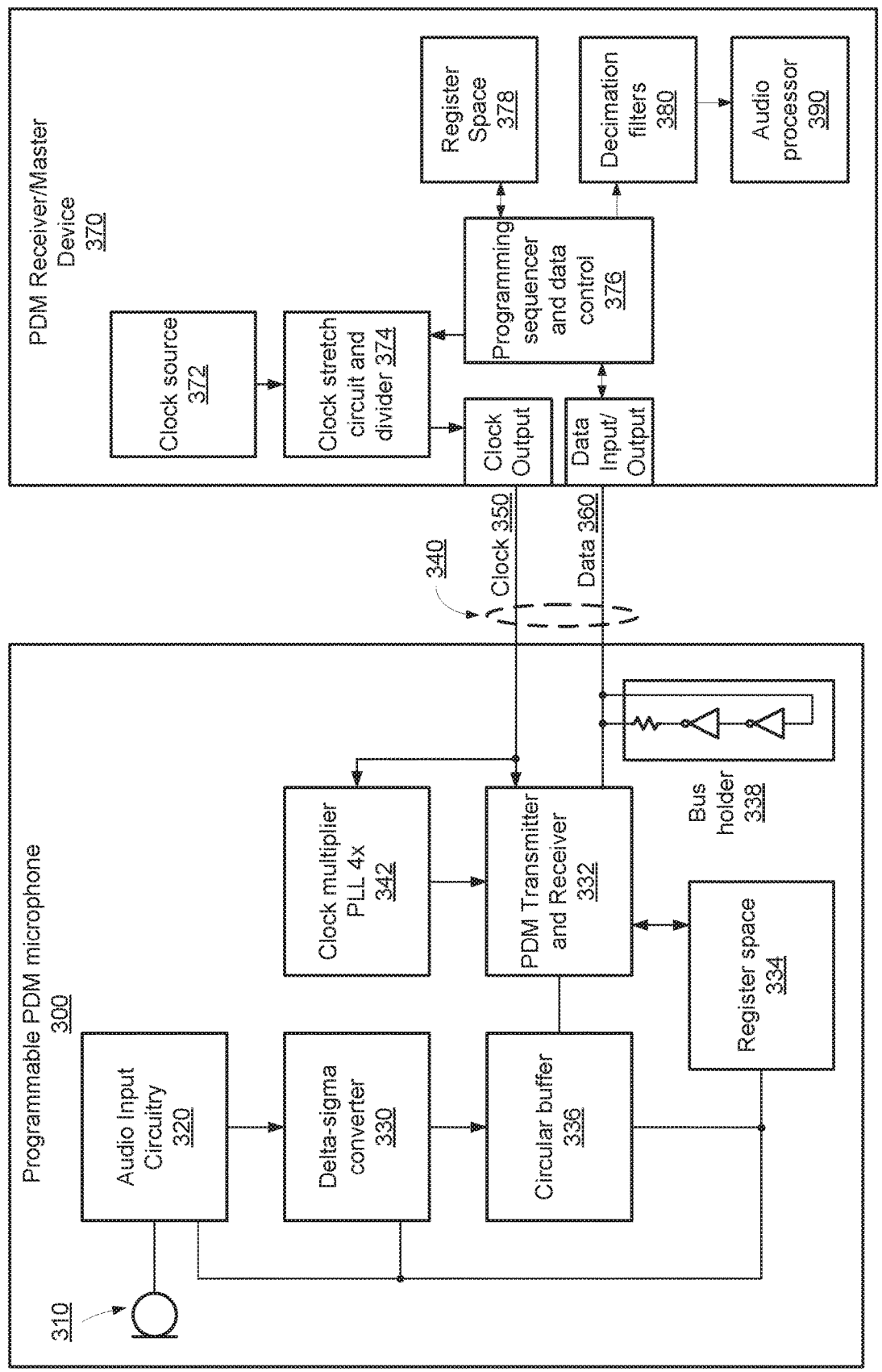
FIG. 3 illustrates a programmable PDM microphone, in accordance with one or more embodiments.

FIG. 3 illustrates a programmable PDM microphone 300, in accordance with one or more embodiments. The gate count used to support this system may be relatively small as described herein, about the same size as an I$^2$C controller. The programmable PDM microphone 300 includes an audio sensor 310, a preamplifier and other audio input circuitry 320, a delta-sigma converter (e.g., single-bit or multi-bit converter), and a PDM transmitter and receiver 332 operable to send out PDM data from the microphone and receive programming data from the PDM Master device (370). The programmable PDM microphone 300 may further include register space 334 (e.g., read/write registers) controlled by the PDM receiver 370 allowing the user to optimize the microphone, and an optional buffer 336 operable to store audio data for some time, for example, for wakeup word systems that store audio data when the PDM receiver is powered down.

The microphone 300 further includes a bus holder 338 to hold the previous value on the bus, if no device is driving it (e.g., if the bus is being tri-stated). The bus holder 338 may have an output impedance of 3-71 kΩ and may be implemented inside the microphone. A clock multiplier 342, which may be implemented for example as a PLL or DLL, is operable to multiply the incoming clock by a factor of four. Thus, if the clock supplied to the microphone is 3.072 MHz, the internal clock will be 12.288 MHz. The output from the PLL/DLL may show a small lag. Thus, the rising edge of the output of the clock from the PLL 342 may be 4-16 ns later than the rising edge of the input clock. To obtain correct timing for data transfers, the PLL/DLL located inside the microphone are given some time to settle. Thus, in various embodiments the microphone 300 does not begin to interpret any data, programming or clock information, before this circuit has fully settled, in order to avoid resulting errors. A settling time for a PLL circuit may be 300-500 cycles. The circuit that disables the interpretation of programming information during initial boot and settling of the timing reference is not shown in the figure but is assumed to be present. The same applies to the Master/receiver device. In various embodiments, it should not begin to program the microphone before the internal timing device has settled, and it should not begin to use audio data from the microphone before it is ready.

The PDM master device 370 includes a clock output 350, a data input/output 360, a clock source 372 and a clock stretch circuit and divider 374. In some embodiments, the clock line may be tri-stated during programming sequences, in order for the microphone device to be able to modulate this line, this would require a bi-directional IO cell for the clock buffer. The clock output 350 may be implemented as a simple IO cell that provides the clock to the microphone 300. The typical output frequency is 3.072 MHz, but it could also be higher or lower in other embodiments (e.g. 768 kHz). The data input/output 360 includes a bi-directional IO cell used to receive PDM data from the microphone 300 and to send programming data to the microphone 300. Sometimes, it can also be used to read register data from the microphone 300. The clock source 372 runs at a higher frequency than the clock supplied to the microphone, and in the illustrated embodiment it runs 4 times faster. This means, if the clock supplied to the microphone is 3.072 MHz, the PDM Master device will use a 12.288 MHz clock as timing element or 24.576 MHz, if only one clock edge from the PLL/DLL is used, i.e. a multiplication of 8. The clock stretch circuit 374 is a special logic circuit that can change the duty cycle of the clock output for a given number of clock periods, e.g., two. This circuit may be used to reset the microphone 300 under special conditions or alternatively used as another means of programming the microphone.

The PDM receiver/maser device 370 may further include programming sequencer and data control logic 376 operable to receive PDM data from the microphone 300 and send commands (serial words) to the microphone 300. It will control the clock supplied to the decimation filters 380. In some special modes, the frequency supplied to the decimation filters 380 could be twice or three times of the clock frequency supplied to the microphone 300. This happens in double or triple bandwidth mode. This logic circuit 376 will also convert multi-bit compressed audio words to linear audio words (see tables in later section).

Register space 378 may be used to control the PDM Master device 370 (e.g., issue read/write commands or force the microphone 300 to work in a special mode). The register values are determined by a CPU or DSP (not shown). The decimation filters 380 filter and down sample the input audio words to a lower sample frequency. The sample rate at the input of the decimation filters 380 of the illustrated embodiment is 3.072 MHz but could be other values in other implementations. The clock is supplied by the programming sequencer 376. An audio processor 390 processes the audio data.

Buffer Circuit

A buffer circuit 336 may be used for glitch-free audio wakeup word. This will enable capture of audio while an audio processor is in sleep mode without losing any audio signals after the system wakes up. In one embodiment, the buffer circuit 336 is configured to operate as follows:

(i) A circular buffer 336 is continuously filled with audio data.

(ii) When a specific event occurs, such as the detection of a wakeup word, the microphone may signal this event to the Master device using either the DATA or CLOCK line.

(iii) After an event has been detected (or not) the Master device may request the buffer to be transferred to the Master device from the microphone by writing a sequence to the microphone.

(iv) The microphone will then set the double or triple bandwidth transfer mode.

(v) Simultaneously, the clocking frequency of the decimation filters will be set to double or triple of the normal clocking frequency and match the bandwidth transfer mode.

(vi) The Master device will tell the microphone to initiate the buffer download and start to receive data at two or three times the normal data rate.

(vii) When data has passed through the Master device decimation filters, the Master device will store the decimated audio data in an intermediate internal buffer located in the audio processor 390. Typically, the output sample rate will be 48 kHz, which means the digital data will be accumulated at a rate of 96 or 144 kHz during the buffer download. Even though these samples are received at these higher rates from the output of the decimation filter, they still represent 48 kHz audio samples and should be processed as such.

(viii) After the buffer has been emptied in the microphone, both the Master device and microphone will switch to single bandwidth mode at the exact moment the buffer is empty.

(ix) The samples from the decimation filters will now appear at 48 kHz and the buffer inside the microphone will neither increase nor decrease in length since all samples are downloaded with the same speed they are sampled.

(x) The output audio values residing inside the Master device internal buffer will be transferred over a network for analysis or used for internal audio processing. When all samples in this buffer has been transferred to the network or for analysis or other audio use, the master device internal buffer will be empty.

Figure 4:
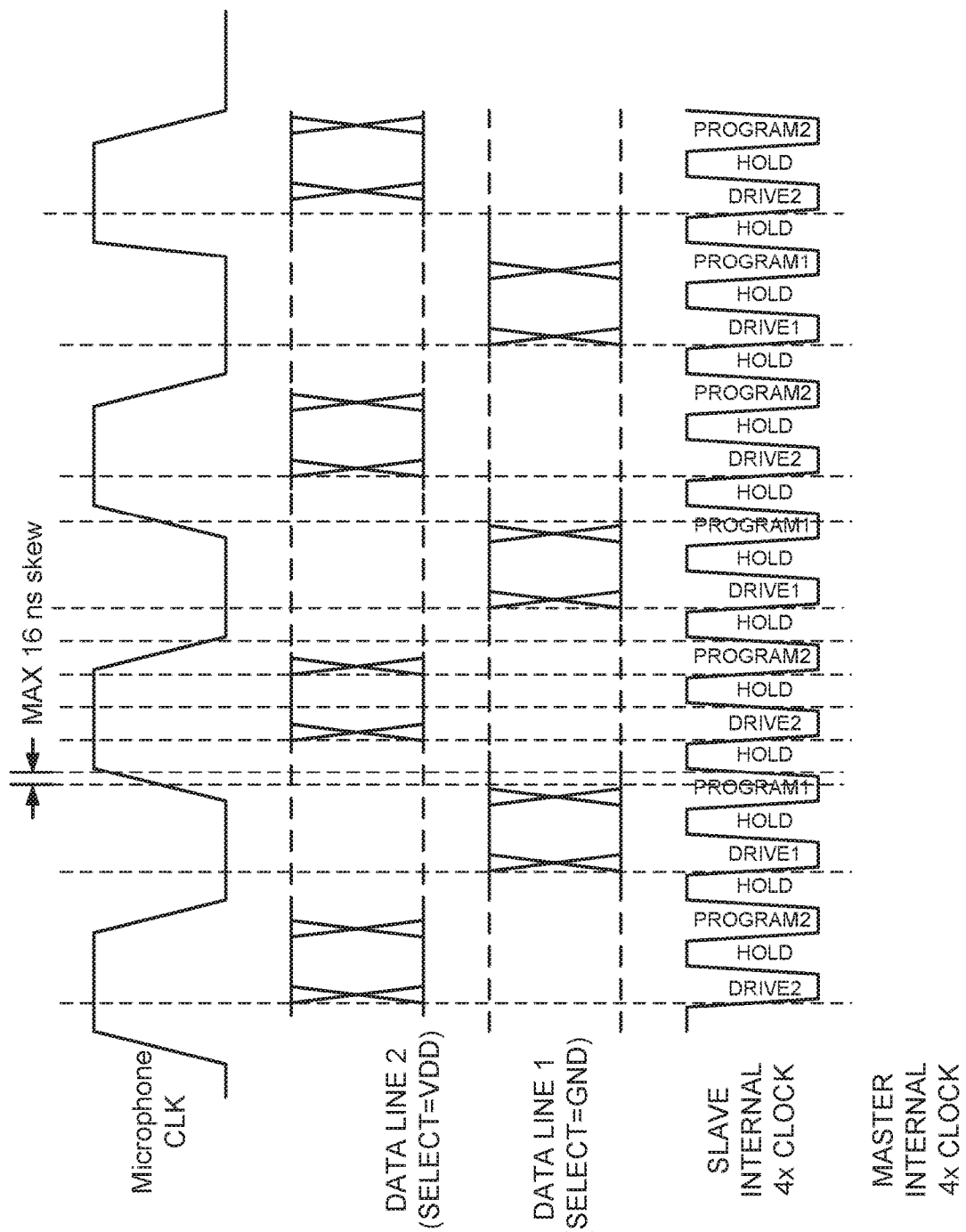
FIG. 4 is a timing diagram for an example programmable PDM microphone, in accordance with one or more embodiments.

Referring to FIGS. 4-13, different modes of operation of the programmable PDM device will now be described. Referring to FIG. 4, a programmable PDM microphone operates similarly to a traditional PDM microphone provided there are no programming data. This operation includes 4 phases: (i) hold data (using bus holder, 3 phases where the bus is hold steady); (ii) drive microphone 1; (iii) hold data (using bus holder, 3 phases where the bus is hold steady); and (iv) drive microphone 2. Note the 4× clock inside the master device 370. As an example, a 12.288 MHz clock is used internally, when sending out a 3.072 MHz clock to the microphone. The bus holder will keep the data level constant from last driving value. The bus holder is integrated inside the microphones for full backwards compatibility, i.e. there is no need for any change to a native PDM Master device.

Figure 5:
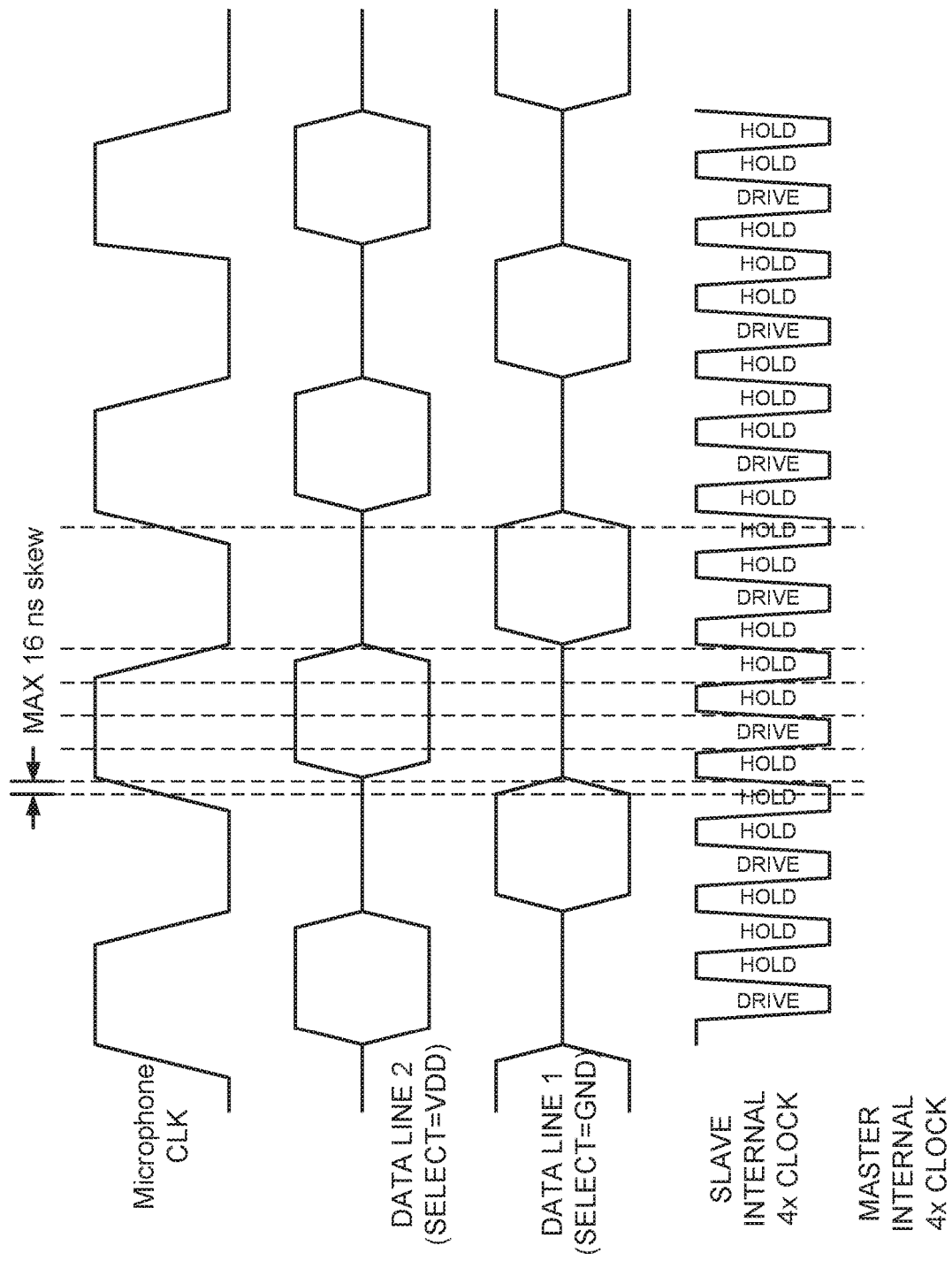
FIG. 5 is a timing diagram illustrating programming of a PDM microphone, sensor or amplifier, in accordance with one or more embodiments.

Referring to FIG. 5, a programmable PDM microphone operates differently compared to a standard PDM microphone operation when programming data is involved. In the illustrated embodiment, an 8 phase cycle incudes: (i) hold data (using bus holder, single cycle); (ii) drive microphone 1; (iii) hold data (using bus holder, single cycle); (iv) drive programming data; (v) hold data (using bus holder, single cycle); (vi) drive microphone 1; (vii) hold data (using bus holder, single cycle); and (viii) drive programming data. As illustrated, a 4× clock inside the Master device is used. As an example, a 12.288 MHz clock is used internally, when sending out a 3.072 MHz clock to the microphone. The bus holder will keep the data level constant from the last driving value. The bus holder is integrated inside the microphones and provides for full backwards compatibility. Note, that one would normally either program microphone 1 or program microphone 2, but implementations do not normally need to support programming of both microphones at same time.

Figure 6:
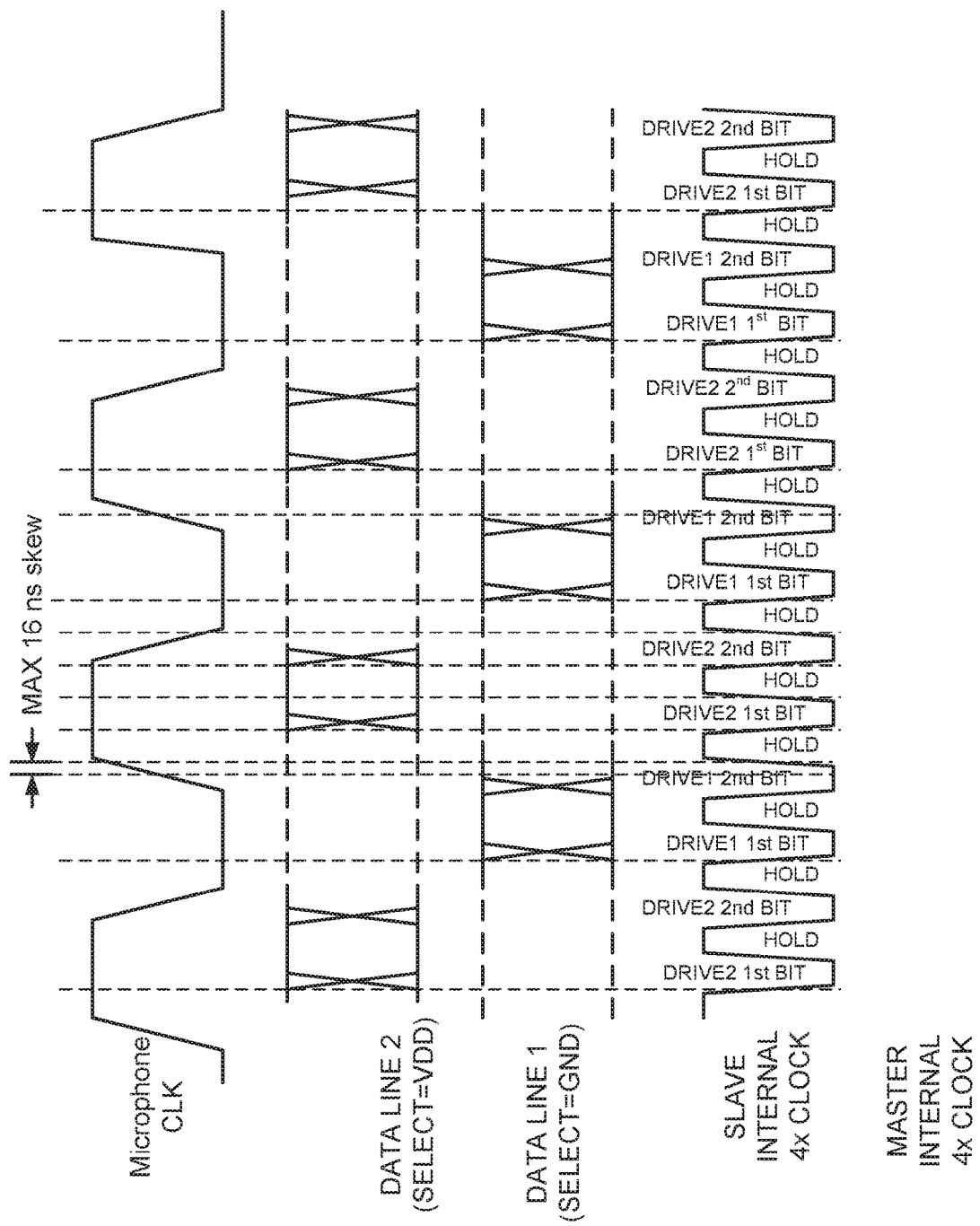
FIG. 6 is a timing diagram illustrating a double bandwidth mode for a programmable PDM microphone, sensor or amplifier, in accordance with one or more embodiments.

Referring to FIG. 6, a double bandwidth mode of operation for the programmable PDM microphone will now be described, in accordance with one or more embodiments. A programmable PDM microphone operates differently compared to a traditional PDM microphone when using the double bandwidth mode. In operation an 8 phase sequence is used: (i) hold data (using bus holder, single cycle); (ii) drive microphone 1, first bit; (iii) hold data (using bus holder, single cycle); (iv) drive microphone 1, second bit; (v) hold data (using bus holder, single cycle); (vi) drive microphone 2, first bit; (vii) hold data (using bus holder, single cycle); and (viii) drive microphone 2, second bit. Note, the use of the 4× clock inside the Master device. As an example, a 12.288 MHz clock is used internally, when sending out a 3.072 MHz clock to the microphone. The bus holder will keep the data level constant from last driving value. The bus holder is integrated inside the microphones to provide for backwards compatibility.

Figure 7:
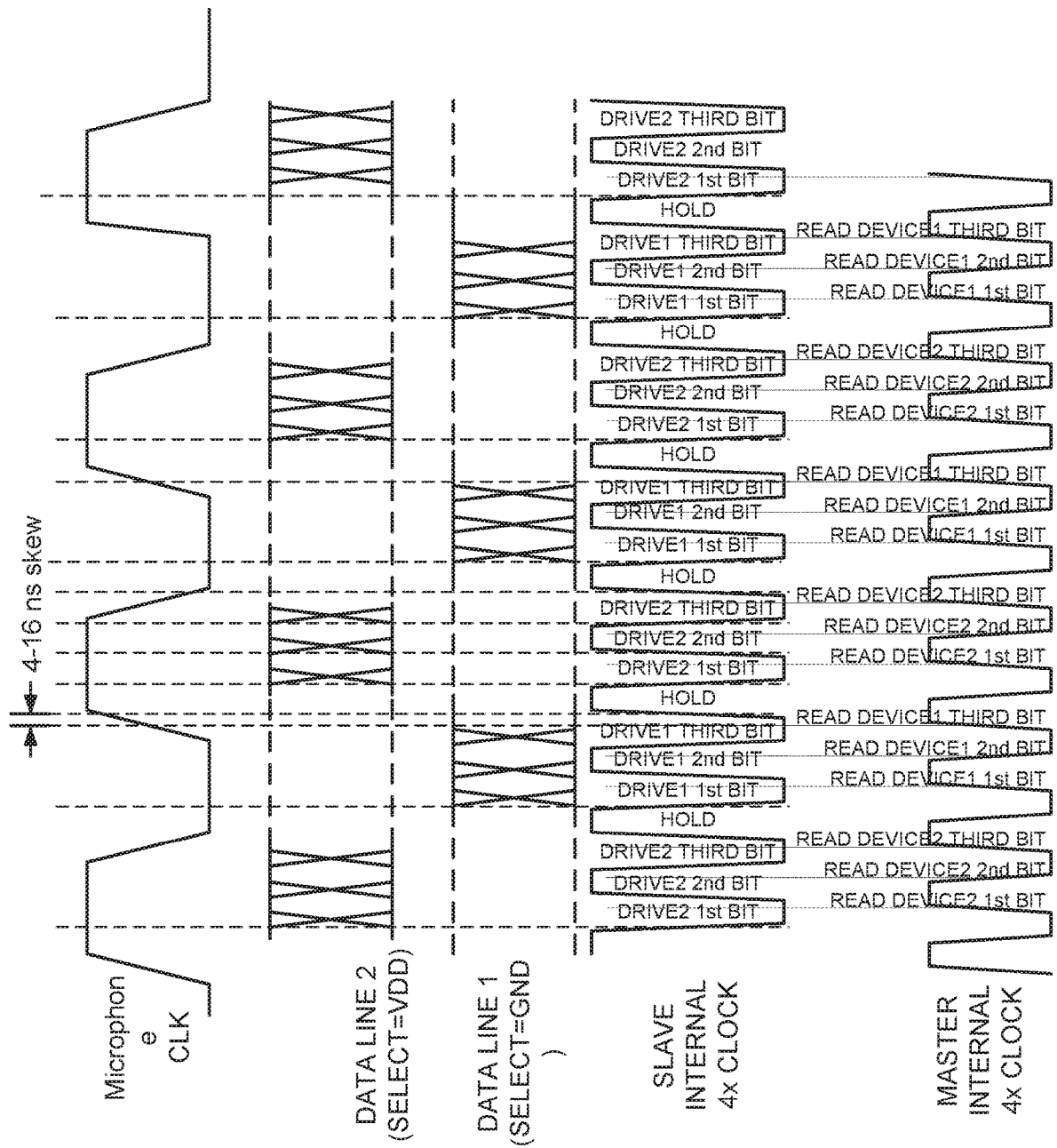
FIG. 7 is a timing diagram illustrating a triple bandwidth mode for a programmable PDM microphone, sensor or amplifier, in accordance with one or more embodiments.

Referring to FIG. 7, operation of a programmable PDM microphone in a triple bandwidth mode will now be described, in accordance with one or more embodiments. This configuration is supported for short bus lengths (e.g., up to 30 cm in some embodiments). This mode involves 8 phases: (i) hold data (using bus holder, single cycle); (ii) drive microphone 1, first bit; (iii) drive microphone 1, second bit; (iv) drive microphone 1, third bit; (v) hold data (using bus holder, single cycle); (vi) drive microphone 2, first bit; (vii) drive microphone 2, second bit; and (viii) drive microphone 2, third bit. In some cases, microphone 1 and microphone 2 may drive the data slots alternatingly for lower latency. Note, Master device may use an 8× clock to optimize the timing margins in this mode. The bus holder will keep the data level constant from last driving value. The encoding may be implemented as follows (many other possibilities are possible, including encoding schemes that include a memory of previous values):

| First bit | Second bit | Third bit | ADC value |
|---|---|---|---|
| 0 | 0 | 0 | −7 |
| 0 | 0 | 1 | −5 |
| 0 | 1 | 0 | −3 |
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

The master device (e.g., master device 370 of FIG. 3) may include a plurality of registers, which will now be described. An address register may include a 16-bit register (read/write) that contains the value of the next address to be submitted. This register should be set before performing a programmable PDM write or read operation. A data register includes a 16-bit register (read/write) that includes the value of the data to be written before performing a programmable PDM write operation or the results of the last read operation. A clock_cycle_removal register includes an 8-bit register (read/write) that contains a counter value to tell how many clock cycles that will be removed to change mode. A status register includes an 8-bit register (read). This is used to exit double and triple bandwidth modes, if the programming is done in the same timeslots as assigned for audio.

The slave device (e.g., programmable PDM microphone 300 of FIG. 3) may include a plurality of registers, which will now be described. An address register may include a 16-bit register (read/write) that contains the value of the address of the last operation. This register is set by PDM write or read operation. A data register includes a 16-bit register (read/write) that includes the value of the data to be written before performing a programmable PDM write operation or the results of the last read operation. A clock_cycle_removal register includes an 8-bit register (read/write) that contains a counter value to tell how many clock cycles that will be removed to change mode. A status register includes an 8-bit register (read).

Programming bits may be encoded by XOR with the previous bitstream sent (e.g., either by Master device or Slave). This is done so that it is easy to detect the start of a sequence and save power (if there is no programming data, the bus will not change). The transmitted bit value may equal the previous bitstream bit XOR the programming bit. In other words, the Master device may initiate a programming sequence by inverting the last value written by a microphone. The microphone will detect the start of the programming sequence by reading back the bit it originally wrote. If the bit has changed, a new programming sequence has been initiated. This scheme saves power by not changing states on the bus unless new information is required to be transferred.

Embodiments of programming sequences will now be described. In one embodiment, support for programming of registers and higher speed modes is provided. The programming bits will appear after the bitstream bits. The sequence of bits are as follows: <Start><Opcode><Address><Data><Parity><Acknowledgment>

Individual Fields Will Now Be Described:

The Start of Sequence={1}: After the microphone writes one bit, the Master device will invert this bit and send it in the programming bit slot. The inversion of the microphone's output data is an indication to the microphone, that a programming sequence is starting. Then follows the opcode of the operation, either read, write or double or triple speed mode. A programming sequence either happens in the microphone 0 programming channel or in microphone 1 programming channel. Only the microphone, whose channel has programming data (indicated by the inverted microphone data) will be affected. Microphone data will always be sent in the same programming slot as the bit stream data from this microphone. The microphone can only exit from double or triple speed mode by using the special clock cycle removal mechanism. If programming is being performing by duty cycle modulation of the clock line, it is not necessary with this exit mechanism. Also, in this case the driving pattern will need to include a bit that indicates the microphone, that is being addressed.

Opcodes

Opcode 1: Start of Read16 {0, 1, 1, 1}: This will start the reading of a 16 bits value from a microphone register. The address to be read will be issued in the address field. The microphone will write the data in the Data field.

Opcode 2: Start of Write16 {1, 0, 1, 1}: This will start the writing of a 16 bits value to a microphone register. The address to be written will be issued in the address field. The Master device will write the data to be written to the microphone register in the Data field.

Opcode 3: Low power speed mode {1, 1, 0, 1}: This will change communication to low power mode (two bits per half cycle from one device). No more programming of this microphone is possible until a double clock removal event is detected. The other microphone should ignore programming data from this channel until a clock removal event has been detected. Normally, the Address and Data field are both set to all zeros before submitting this Opcode.

Opcode 4: Double symbol mode {1, 1, 1, 0}: This will change speed to double symbol mode (one symbol per half cycle, 4 values possible with two bits). No more programming of this microphone is possible until a double clock removal event is detected. The other microphone should ignore programming data from this channel until a clock removal event has been detected. Normally, the Address and Data field are both set to all zeros before submitting this Opcode.

Opcode 5: Triple symbol mode {1, 0, 0, 0}: This will change speed to triple speed. No more programming of this microphone is possible until a double clock removal event is detected. The other microphone should ignore programming data from this channel until a clock removal event has been detected. Normally, the Address and Data field are both set to all zeros before submitting this Opcode. The triple speed mode may be used to transfer one symbol per half-cycle (8 values possible) or for fast download of an audio buffer.

Future opcodes (not defined, ignore): {0, 1, 0, 0}, {0, 0, 1, 0}, {0, 0, 0, 1}

Illegal opcodes: All other values (all combinations of two zero and two ones)

Address {A15, A14, A13, A12, A11, A10, A9, A8, A7, A6, A5, A4, A3, A2, A1, A0} (address for read/write): A 16 bits address issued to select the correct register. The MSB is sent first.

Data {D15, D14, D13, D12, D11, D10, D9, D8, D7, D6, D5, D4, D3, D2, D1, D0}: (register data r/w): This field contains register data. The MSB is sent first.

Parity {P}: The parity of all bits in the programming sequence (including the start bit and the parity bit) should be even.

Acknowledgement {A}: This bit is sent from a microphone to the Master device. If this bit is high, the message was received correctly. If this bit is low, there was an error (e.g. the device is not ready or there was a parity error). The Master device should issue an IRQ to the controller (CPU or DSP) that the operation failed along with a copy of the address and register data that failed.

Wakeup circuit. In some embodiments, the Master device may program the Slave device (e.g. a microphone) to go into sleep mode for reduced power consumption. The Master device may then leave the DATA or CLOCK line at a static level afterwards, typically at the low level and this level will be maintained by a bus holder (to be implemented on the DATA or CLOCK line or both). Afterwards either the Slave or Master device may change the level of this line (CLOCK or DATA) and thereby provide a wakeup mechanism for other devices attached to the bus. This circuit is not shown in the figures but are assumed to be present when needed. After the level change has been detected, the Master device and Slave wake up internal circuits, then resume clocking and start any programming after the slave device has achieved correct timing alignment.

Clock Stretch

Figure 8:
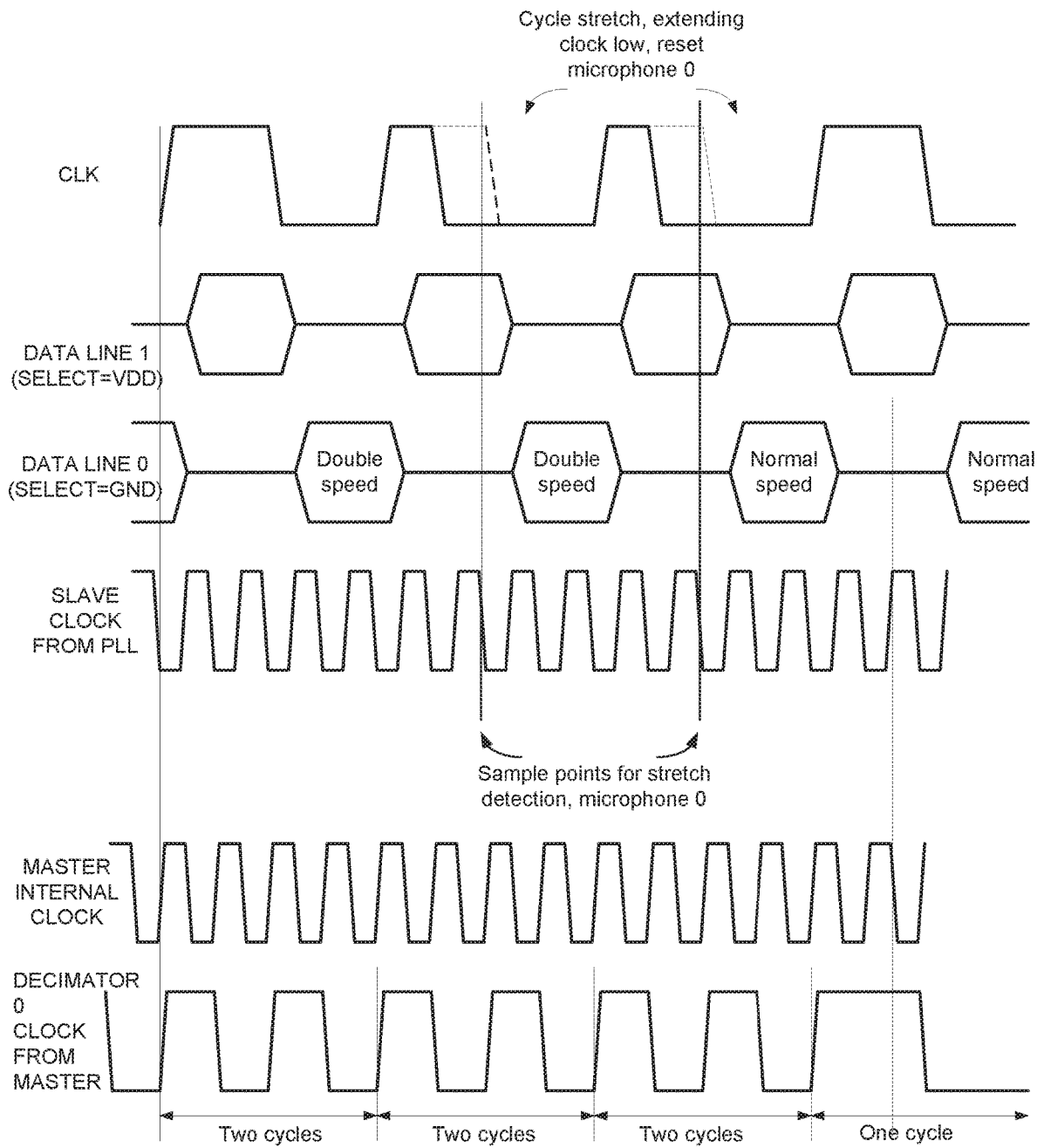
FIG. 8 is a timing diagram illustrating a clocking scheme for a programmable PDM microphone, sensor or amplifier, in accordance with one or more embodiments.
Figure 9:
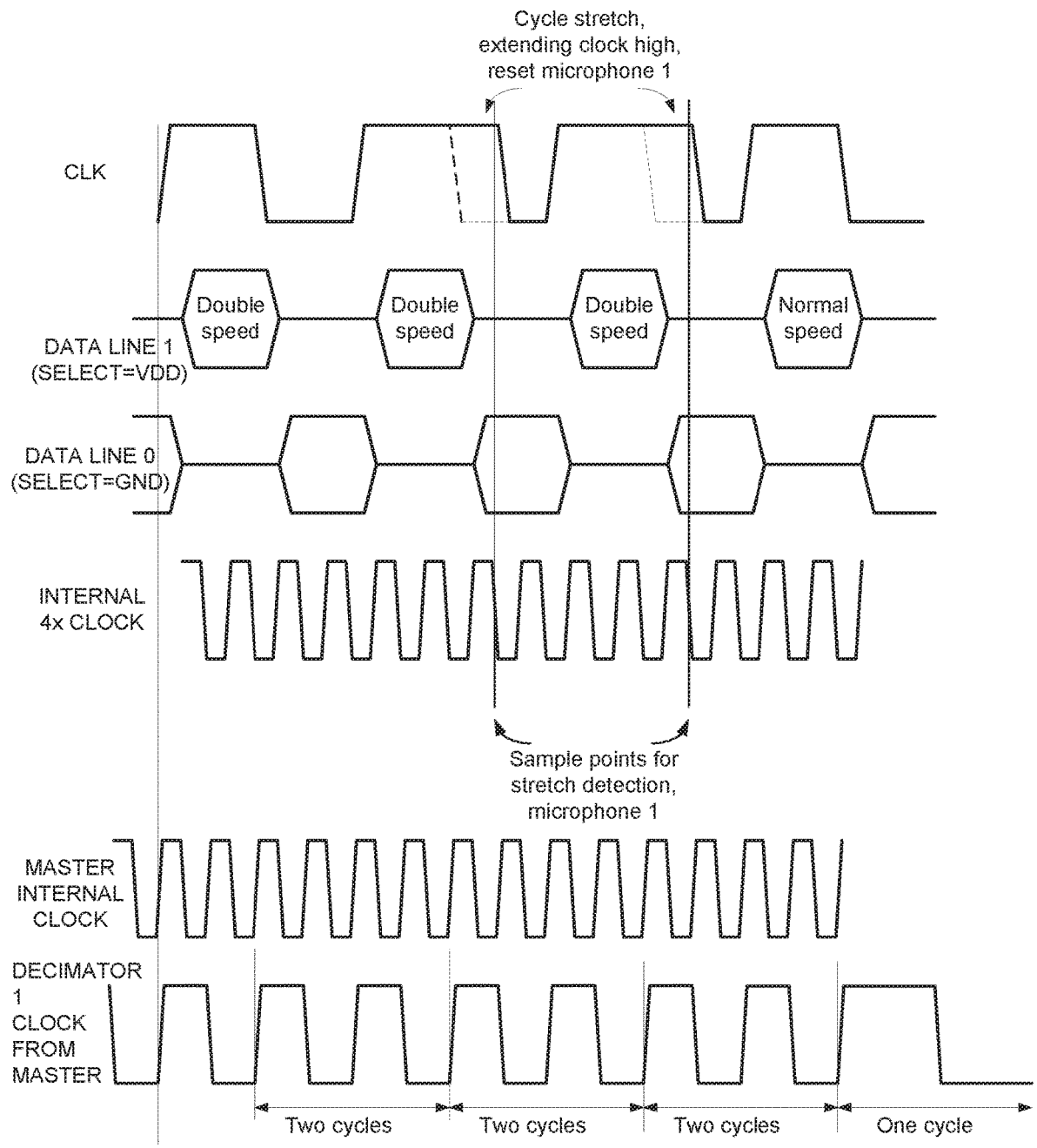
FIG. 9 is a timing diagram illustrating a clocking scheme for changing from dual or triple speed mode, in accordance with one or more embodiments.

An embodiment will now be described with reference to FIG. 8. If a positive clock pulse is shorted from a 50% duty cycle to a 25% duty cycle for two pulses, microphone 0 will abort dual or triple bandwidth mode (if in this mode) Similarly, if a positive clock pulse is stretched from a 50% duty cycle to a 75% duty cycle for two pulses, microphone 1 will abort dual or triple bandwidth mode (if in this mode). This means that all rising clock edges will not be affected by a change in mode. Otherwise, there is a risk of wrong timing alignment, programming errors, audio problems etc. This also means the PLL/DLL may use the rising edges as timing reference. Similarly, for changing from dual or triple speed mode in microphone 1, we will have the timing illustrated in FIG. 9. These two figures all shows the timing for the clock supplied to the decimator sections. Notice, the clock to the decimator will be reduced.

Programming examples will now be described with reference to FIGS. 10-13. Bus output values, for these examples, it is assumed that microphone 0 will send the following sequence {K0, K1, K2, K3, K4 . . . } where Kx is {0 or 1} is the microphone 0 PDM data while microphone 1 will send the other sequence {L0, L1, L2, L3, L4 . . . } where Lx is {0 or 1} and is the microphone 1 PDM data. H is a Hold value, the bus holders inside the microphones will keep the last value, all output drivers are inactive, tri-stated, and P is the Master device program value. Bus drivers include B which represents Bus holder is maintaining the last bus value, S0 is Microphone 0 is driving the bus, S1 is Microphone 1 driving the bus, M is Master device driving the bus.

An example of a programmable PDM output sequence, no programming, audio only will now be described. A PDM+ sequence of audio data with no programming may look like the sequence illustrated in FIG. 10.

FIG. 11 illustrates an example output sequence, register read, in accordance with one or more embodiments. In the illustrated example, it is assumed that ADDRESS=0xF901 and that DATA (the register value returned from the microphone) is 0x81C7. A read from microphone 0 is performed.

FIG. 12 illustrates an example programming sequence showing only the time slots that include programming data. FIG. 13 illustrates a programmable PDM output sequence, register write, in accordance with one or more embodiments. In the illustrated example, it is assumed that ADDRESS=0x7654 and that DATA (the register value written to the microphone) is 0x1234. We are performing a write to microphone 1, and only the programming bits are shown.

Figure 14:
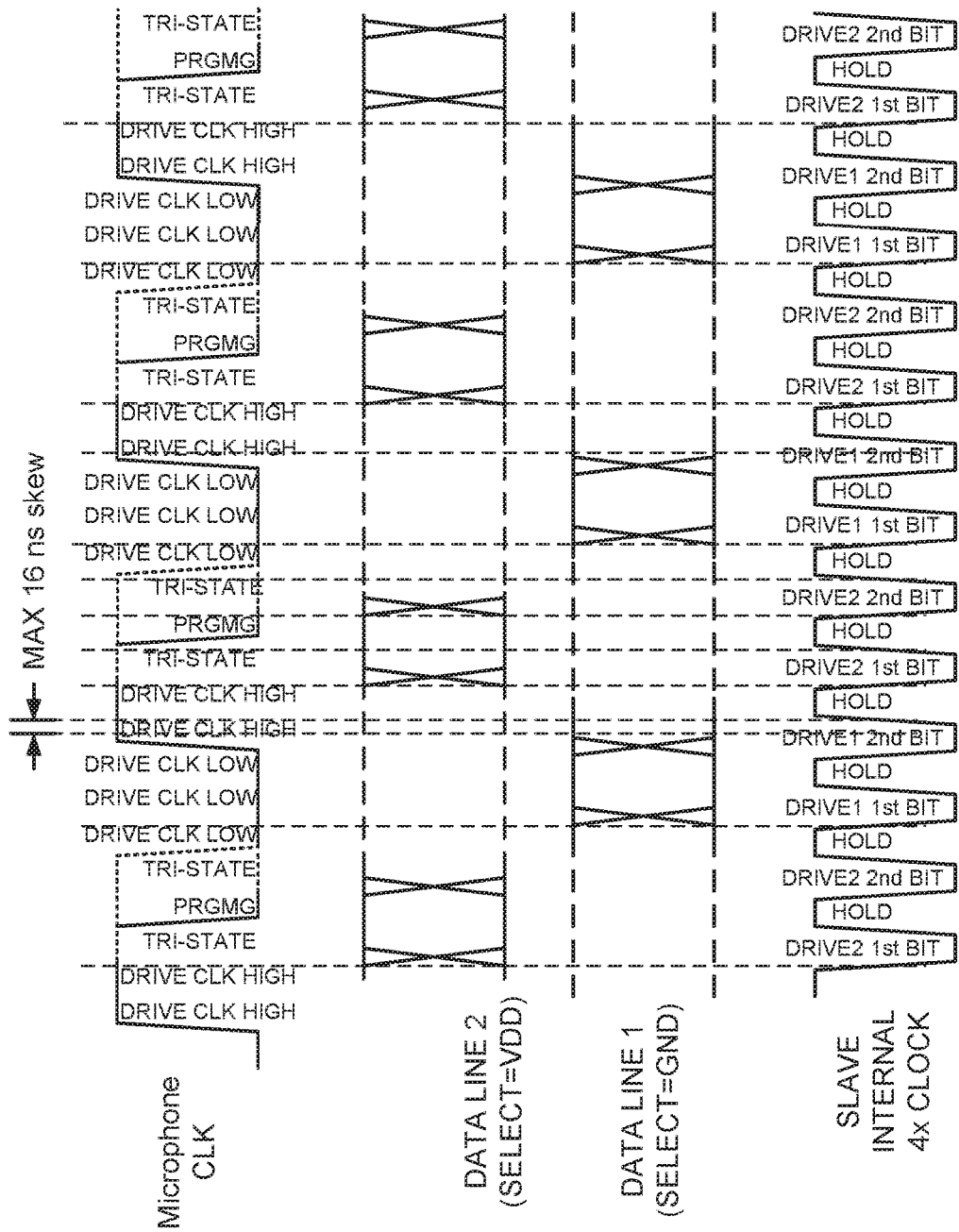
FIG. 14 is a timing diagram illustrating an alternate programming channel for a programmable PDM microphone, sensor or amplifier, in accordance with one or more embodiments.

FIG. 14 shows an example of using programming using the clock line. Instead of using the second data slot in every half cycle for programming (initiated by setting the data level to the opposite of what was written by the microphone), it is possible to perform all programming using the clock line only. In this case, we would use the normal clock patterns {1, 1, 1, 1} during normal clock high and {0, 0, 0, 0} during clock low.

When we want to program a microphone, we would initiate a sequence similar to earlier sequences using clock high {1, 1, Z,0} (where Z is tri-stated and '0' initiates the programming sequence) and complete this with a low clock cycle of {Z, 0, 0, 0). Individual bits P would then be transferred as follows: Clock high is {1, 1, Z, P} and clock low is {Z, 0, 0, 0}. It can be seen, there is a tri-state period before and after the programming bit, and this bit would both be set by the Master device and Microphone 1 or 2. In other words, the P bit would be bi-directional and the actual programming bit.

In some embodiments, the Master device might also initiate a programming sequence using {1, 1, 1, 0} or {1, 1, 0, 0} and end it with {0, 0, 0, 0}. In these cases, the bus is in low impedance during the entire start of the programming sequence. An advantage of using the approach described here is, that when programming is not being performed, the Master device will drive the clock line all the time. Therefore, this will represent a lower impedance as compared to using tri-state before each programming bit. Furthermore, the programming and audio bits are fully separated on two opposite lines. Finally, for debugging, it is easier to identify programming sequences because they cannot be confused with audio data. The drawing on the next page shows this scheme. It may be noticed, that this scheme maintains the rising edges of the clock and the programming sequence will also need to include a bit for the Microphone number (1 or 2), typically sent after the programming start sequence, i.e. the programming sequence would be as follows:

<Start><Device number><Opcode><Address><Data><Parity><Acknowledgment>.

The advantage of this approach is, that the audio data and programming data are not mixed. This allows for safer operation and easier debugging of system (programming sequences are easier to identify).

In some embodiments, the delta-sigma converter inside the PDM transmitter may employ a multi-bit to multi-bit compression algorithm such as to reduce the number of bits to be transferred over the digital link. A compression algorithm such as delta modulation or adaptive delta modulation may be used to reduce the number of bits transferred. The actual value to be transferred over the link may be different from the output from a multi-value delta-sigma converter. In this case, the value that is going to be used in the feedback loop of the delta-sigma converter, will be the decompressed value that has been transferred over the bus, not the value that is output from the multi-value ADC inside the delta-sigma converter, neither the actual value on the bus.

Similarly, when a single bit value is used to represent a value from the delta-sigma converter, this single value may represent a compressed version of a multi-value converter, compressed into a single bit. Again, in this case the value that is used in the feedback loop of the delta-sigma converter will not be the output from the internal ADC, but the decompressed value that is being transferred over the bus and not the actual value that is being transferred over the bus.

Furthermore, when using compression/decompression methods for increasing the dynamic range of a delta-sigma converter, there will be built in mechanisms to correct for error conditions, such that the output values shall stay within a certain range and in case of error, the receiver will get back in sync with the transmitter e.g. by detecting boundary conditions (approach upper or lower floor of decompressor).

An example of a delta encoding mechanism will compare the previous value from the ADC to the new one. If this value is higher, a logic high will be sent, while if a lower value is present, a low will be sent. These values will be compared to the integrated value of the feedback, with a certain given increment D every time a decision is made. In other words, the integrated delta values from the ADC will be used for the feedback in the delta-sigma converter and the receiver of the values will similarly integrate the delta values received over the bus. The concept may be extended to included adaptive delta encoding, where the step values will adjust to larger or smaller ADC values.

Figure 15:
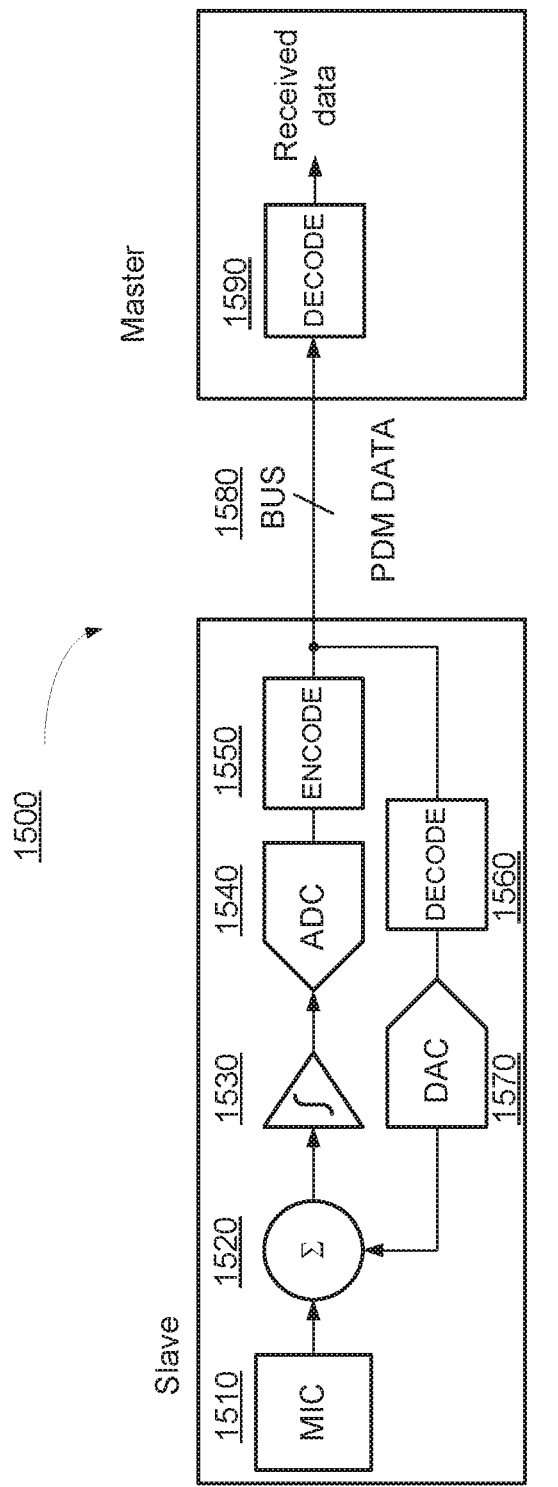
FIG. 15 illustrates an example PDM transmitter with enhanced dynamic range using encoding and decoding of the levels quantized in a delta-sigma converter loop, in accordance with one or more embodiments.

The advantage of including an encode/decode circuit for reducing the number of bits transferred over the bus, is that we can either increase the dynamic range for a given sample rate or we can reduce the sample rate while maintaining the same dynamic range, thereby reducing the power consumption. Embodiments of encoding/decoding circuit will be further described with reference to FIG. 15, which shows a simplified example that may be supplemented with additional elements from FIGS. 1-14 in a real system. As illustrated, a system 1500 containing compression of audio data for reduced bandwidth requirements, microphone element 1510, preamplifier and signal conditioning circuitry, a summing element 1520 (e.g., part of a delta-sigma converter), integrator 1530 (switched capacitor or continuous time type), quantizer 1540 (e.g., a simple analog to digital converter), digital encode circuit 1550 to reduce the number of bits, decode circuit 1560 to obtain the current value transferred, digital to analog converter 1570 to provide feedback for the delta-sigma loop, a digital bus system 1580 similar to what has been earlier described in this application, a decoder 1590 that translates the receives values into a representation (approximate or exact) of the values that have been sampled earlier. Note, many types of delta-sigma converters are possible, and this is just an illustration of one embodiment.

Where applicable, various embodiments provided by the present disclosure may be implemented using hardware, software, or combinations of hardware and software. Also, where applicable, the various hardware components and/or logic components set forth herein may be combined into composite components comprising software, hardware, and/or both without departing from the scope of the present disclosure. Where applicable, the various hardware components and/or logic components set forth herein may be separated into sub-components comprising software, hardware, or both without departing from the scope of the present disclosure. In addition, where applicable, it is contemplated that software components may be implemented as hardware components and vice versa. The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure.

Having thus described embodiments of the present disclosure, persons of ordinary skill in the art will recognize that changes may be made in form and detail without departing from the scope of the present disclosure.

What is claimed:

1. A system comprising:
    a programmable pulse density modulation (PDM) device;
    a PDM master device; and
    a bus communicably coupling the programmable PDM device to the PDM master device;
    wherein the PDM master device is configured to manage bus communications for a plurality of operating modes including a predefined PDM operating mode and a plurality of programmable modes;
    wherein the plurality of programmable modes are configured by splitting a clock cycle of the predefined PDM operating mode into additional phases to provide bandwidth for programmable mode control signals; and
    wherein the PDM device includes a PDM transmitter configured to:
        transmit, to the PDM master device, audio data over a first transmission line of the bus and a clock signal associated with the audio data over a second transmission line, disposed opposite the first transmission line, of the bus;
        modulate the clock signal to carry first programming data for programming the PDM device, the first programming data being carried from the PDM device to the PDM master device; and
        set an output level of the bus during a half clock cycle and maintain the output level using a bus holder in the predefined PDM operating mode for the rest of the half clock cycle.

2. The system of claim 1, wherein the PDM device further includes an audio sensor, audio input circuitry, a delta-sigma converter, the bus holder and a PDM receiver.

3. The system of claim 2, wherein the PDM receiver is configured to receive second programming data for programming the PDM device from the PDM master device.

4. The system of claim 3, wherein the PDM device further comprises register space controlled by the PDM master device.

5. The system of claim 3, wherein the PDM device further comprises a buffer to store the audio data for a wakeup word system that stores the audio data when the PDM receiver is powered down; wherein at least one of the plurality of programmable modes is configured to allocate an extra channel for high speed transfer of the audio data after detection of a wakeup word; and wherein the PDM master device and PDM device are configured to switch to a single bandwidth mode after the buffer is empty.

6. The system of claim 1, wherein the PDM device further comprises two microphones and wherein the PDM device is configured to support two audio channels over the first transmission line of the bus between the PDM device and the PDM master device.

7. The system of claim 1, wherein the PDM device further comprises a clock multiplier configured to multiply an incoming clock signal by a factor of four.

8. The system of claim 1, wherein the PDM master device comprises a clock output, a data input/output, a clock source and a clock stretch circuit and divider; wherein the clock output provides a clock signal to the PDM device; and wherein programming the PDM device and/or operation of a new programmed mode is delayed to allow an internal clock of the PDM device to settle.

9. The system of claim 1, wherein the plurality of programmable modes comprises a triple bandwidth mode.

10. The system of claim 8, wherein the data input/output includes bi-directional communications to receive the audio data from the PDM device and to transmit second programming data for programming the PDM device.

11. The system of claim 1, wherein a clock stretch circuit is configured to change a duty cycle of a clock output for a given number of clock periods; and wherein the clock stretch circuit is configured to reset the PDM device when predetermined conditions are detected.

12. The system of claim 1, wherein the PDM master device includes data control logic configured to receive the audio data from the PDM device and transmit commands to the PDM device.

13. The system of claim 1, wherein the PDM master device includes register space used to control the PDM master device.

14. The system of claim 1, wherein the PDM master device includes decimation filters configured to filter and down sample input audio.

15. The system of claim 1, wherein a PDM master clock signal is tri-stated for a given time to allow for a shorter or longer duty cycle, to be determined by the PDM master device or the PDM device.

16. The system of claim 15, wherein varying the duty cycle of the clock cycle is used to convey programming information from the PDM master device to the PDM device or from the PDM device to the PDM master device.

17. A method comprising:
providing a programmable pulse density modulation (PDM) device, a PDM master device and a bus communicably coupling the programmable PDM device to the PDM master device;
managing, by the PDM master device, bus communications for a plurality of operating modes including a predefined PDM operating mode and a plurality of programmable modes;
setting an operating mode based on first programming data for programming the PDM device received from the PDM master device;
transmitting from the PDM device to the PDM master device, audio data over a first transmission line of the bus using the set operating mode;
transmitting from the PDM device to the PDM master device, a clock signal associated with the audio data over a second transmission line, disposed opposite the first transmission line, of the bus using the set operating mode;
modulating the clock signal to carry second programming data for programming the PDM device over the second transmission line of the bus using the set operating mode, the second programming data being carried from the PDM device to the PDM master device; and
setting an output level of the bus during a half clock cycle and maintaining the output level using a bus holder in the predefined PDM operating mode for the rest of the half clock cycle, wherein the plurality of programmable modes are configured by splitting a clock cycle of the predefined PDM operating mode into additional phases to provide bandwidth for programmable mode control signals.

18. The method of claim 17, further comprising:
controlling, by the PDM master device, a PDM device register space comprising an address register, a data register, and/or a clock cycle removal register.

19. The method of claim 17, further comprising:
storing, by a buffer of the PDM device, the audio data for wakeup word systems that store the audio data when a receiver of the PDM device is powered down; and
switching to a double bandwidth programmable mode or a triple bandwidth programmable mode after detecting the wakeup word to empty the stored audio data.

20. The method of claim 17, further comprising:
holding, using the bus holder, the previous value on the bus if no device is driving the bus, wherein the PDM device includes the bus holder.

* * * * *